United States Patent
Emira et al.

(10) Patent No.: US 11,456,731 B1
(45) Date of Patent: Sep. 27, 2022

(54) DEGLITCH CIRCUIT

(71) Applicant: SHENZHEN GOODIX TECHNOLOGY CO., LTD., Shenzhen (CN)

(72) Inventors: Ahmed Emira, San Diego, CA (US); Mohamed Aboudina, San Diego, CA (US); Faisal Hussien, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/372,504

(22) Filed: Jul. 11, 2021

(51) Int. Cl.
  *H03K 5/125* (2006.01)
  *H03K 3/037* (2006.01)
  *H03K 5/1252* (2006.01)

(52) U.S. Cl.
  CPC ............. *H03K 5/125* (2013.01); *H03K 3/037* (2013.01); *H03K 5/1252* (2013.01)

(58) Field of Classification Search
  CPC ...... H03K 5/125; H03K 3/037; H03K 5/1252; H03K 17/16; H03K 19/00346; H03K 19/00361
  See application file for complete search history.

(56) References Cited

U.S. PATENT DOCUMENTS

| | | | |
|---|---|---|---|
| 3,624,518 A | 11/1971 | Dildy, Jr. | |
| 5,514,993 A | 5/1996 | Adachi | |
| 11,005,459 B1 | 5/2021 | Hess et al. | |
| 2022/0077830 A1* | 3/2022 | Duan | H04L 25/03878 |

\* cited by examiner

*Primary Examiner* — Jung Kim
(74) *Attorney, Agent, or Firm* — Kilpatrick Townsend & Stockton, LLP

(57) ABSTRACT

An electronic system is disclosed. The system has a differential signal generator configured to generate first and second single ended signals having opposite polarities. The input signal, and the first and second single ended signals transition between a first power voltage and a first ground voltage. The system also has a glitch management circuit configured to generate an output signal based on the first and second single ended signals, where the output signal transitions between a second power voltage and a second ground voltage. The glitch management circuit includes a first latch configured to receive the first and second single ended signals, and to generate first and second intermediate signals. The first and second intermediate signals each transition between the second power voltage and the second ground voltage. The system also has a second latch configured generate the output signal based on the first and second intermediate signals.

20 Claims, 6 Drawing Sheets

DEGLITCH CIRCUIT

TECHNICAL FIELD

The subject matter described herein relates to deglitch circuit, and more particularly to deglitch circuit which may be used for signals crossing power domains.

BACKGROUND

Certain systems, such as cell phones and other electronic systems, are especially sensitive to signals having glitches, such as those caused by ESD, noise, or other glitch inducing events. For example, glitches in certain reset, clock, and mode control signals which cross from a first power domain to a second power domain may cause system failures. The system failures may, for example, result in automatic system resetting or crashing such that the user needs to reset or restart the system.

SUMMARY

One inventive aspect is an electronic system. The system has a differential signal generator including one or more differential signal generator components collectively configured to receive an input signal and to generate first and second single ended signals based on the input signal, where the first and second single ended signals have opposite polarities, where the input signal transitions between a first power voltage and a first ground voltage, and where each of the first and second single ended signals transition between the first power voltage and the first ground voltage. The system also has a glitch management circuit including one or more glitch management components collectively configured to receive the first and second single ended signals, and to generate an output signal based on the first and second single ended signals, where the output signal transitions between a second power voltage and a second ground voltage, where the glitch management circuit includes first latch configured to receive the first and second single ended signals, and to generate first and second intermediate signals based on the first and second single ended signals. The first and second intermediate signals each transition between the second power voltage and the second ground voltage. The system also has a second latch configured to receive the first and second intermediate signals, and to generate the output signal based on the first and second intermediate signals.

In some embodiments, at least one of A) the first single ended signal has a first signal glitch as a result of either or both of the first power voltage and the first ground voltage changing with respect to either or both of the second power voltage and the second ground voltage, and where the glitch management circuit is configured to suppress the first signal glitch, and B) the second single ended signal has a second signal glitch as a result of either or both of the first power voltage and the first ground voltage changing with respect to either or both of the second power voltage and the second ground voltage, and where the glitch management circuit is configured to suppress the second signal glitch.

In some embodiments, at least one of A) the first single ended signal has first and second signal glitches as a result of either or both of the first power voltage and the first ground voltage changing with respect to either or both of the second power voltage and the second ground voltage, where the first and second signal glitches have opposite polarity, and where the glitch management circuit is configured to suppress the first and second signal glitches, and B) the second single ended signal has third and fourth signal glitches as a result of either or both of the first power voltage and the first ground voltage changing with respect to either or both of the second power voltage and the second ground voltage, where the third and fourth signal glitches have opposite polarity, and where the glitch management circuit is configured to suppress the third and fourth signal glitches.

In some embodiments, the first latch is configured to receive the first, second, third, and fourth glitches, to propagate the first glitch to the second intermediate signal, to propagate the third glitch to the first intermediate signal, and to suppress the second and fourth glitches so that the second and fourth glitches do not propagate to the first and second intermediate signals, where the first and third glitches have the same first polarity, and where the second and fourth glitches have the same second polarity.

In some embodiments, the second latch is configured to receive the propagated first and third glitches from the first latch, and to suppress the propagated first and third glitches so that the propagated first and third glitches do not further propagate to the output signal.

In some embodiments, the differential signal generator includes an inverting signal path configured to receive the input signal and to generate the first single ended signal based on the input signal, where the first single ended signal and the input signal have opposite polarities, and a non-inverting signal path configured to receive the input signal and to generate the second single ended signal based on the input signal, where the second single ended signal and the input signal have the same polarity.

In some embodiments, the first latch includes a first SR (set/reset) latch, and where the second latch includes a second SR latch.

In some embodiments, the first and second power voltages are different.

In some embodiments, the first and second power voltages are substantially equal.

In some embodiments, the first and second ground voltages are different.

In some embodiments, the first and second ground voltages are substantially equal.

Another inventive aspect is a method of using an electronic system, the electronic system including a differential signal generator and a glitch management circuit. The method includes, with one or more differential signal generator components of the differential signal generator, receiving an input signal, and with the differential signal generator components, generating first and second single ended signals based on the input signal, where the first and second single ended signals have opposite polarities, where the input signal transitions between a first power voltage and a first ground voltage, and where each of the first and second single ended signals transition between the first power voltage and the first ground voltage. The method also includes, with one or more glitch management components, receiving the first and second single ended signals, and with the glitch management components, generating an output signal based on the first and second single ended signals, where the output signal transitions between a second power voltage and a second ground voltage. The glitch management circuit includes a first latch configured to receive the first and second single ended signals, and to generate first and second intermediate signals based on the first and second single ended signals, where the first and second intermediate signals each transition between the second power voltage and the second ground voltage. The glitch management circuit also includes a second latch configured to receive the first and second intermediate signals, and to generate the output signal based on the first and second intermediate signals.

In some embodiments, at least one of A) the first single ended signal has a first signal glitch as a result of either or both of the first power voltage and the first ground voltage changing with respect to either or both of the second power voltage and the second ground voltage, and where the method further includes, with the glitch management circuit suppressing the first signal glitch, B) the second single ended signal has a second signal glitch as a result of either or both of the first power voltage and the first ground voltage changing with respect to either or both of the second power voltage and the second ground voltage, and where the method further includes, with the glitch management circuit suppressing the second signal glitch.

In some embodiments, at least one of A) the first single ended signal has first and second signal glitches as a result of either or both of the first power voltage and the first ground voltage changing with respect to either or both of the second power voltage and the second ground voltage, where the first and second signal glitches have opposite polarity, and where the method further includes, with the glitch management circuit suppressing the first and second signal glitches, and B) the second single ended signal has third and fourth signal glitches as a result of either or both of the first power voltage and the first ground voltage changing with respect to either or both of the second power voltage and the second ground voltage, where the third and fourth signal glitches have opposite polarity, and where the method further includes, with the glitch management circuit suppressing the third and fourth signal glitches.

In some embodiments, the first latch is configured to receive the first, second, third, and fourth glitches, to propagate the first glitch to the second intermediate signal, to propagate the third glitch to the first intermediate signal, and to suppress the second and fourth glitches so that the second and fourth glitches do not propagate to the first and second intermediate signals, where the first and third glitches have the same first polarity, and where the second and fourth glitches have the same second polarity.

In some embodiments, the second latch is configured to receive the propagated first and third glitches from the first latch, and to suppress the propagated first and third glitches so that the propagated first and third glitches do not further propagate to the output signal.

In some embodiments, the differential signal generator includes an inverting signal path configured to receive the input signal and to generate the first single ended signal based on the input signal, where the first single ended signal and the input signal have opposite polarities, and a non-inverting signal path configured to receive the input signal and to generate the second single ended signal based on the input signal, where the second single ended signal and the input signal have the same polarity.

In some embodiments, the first latch includes a first SR (set/reset) latch, and where the second latch includes a second SR latch.

In some embodiments, the first and second power voltages are different.

In some embodiments, the first and second power voltages are substantially equal.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Figure 1:
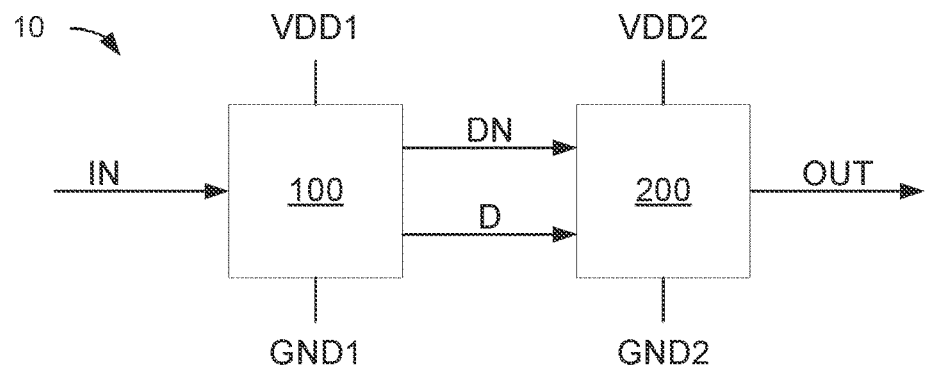
FIG. 1 illustrates a schematic diagram of a signal transmission system according to an embodiment.

As discussed in further detail below, systems may employ glitch management circuitry to reduce or eliminate glitches from signals. The systems, such as cell phones and other electronic systems, may be especially sensitive to the glitches, which, for example, may be caused by ESD, noise, or other glitch inducing events. For example, glitches in certain reset, clock, and mode control signals which cross from a first power domain to a second power domain may have glitches caused by independent changes in the power and/or ground voltages of the first and second power domains. Glitches in these and other signals may cause system failures. The system failures may, for example, result in automatic system resetting or crashing such that the user may, for example, need to reset or restart the system.

Certain glitch management circuits are based on time delay digital circuits. For example, a transition between digital states in a signal may not be passed until the new state has persisted for a certain time. Accordingly, glitches which persist for less than the delay time, are not passed. Time delay solutions are not effective in systems where glitch durations are significant compared to the timescales of the system. For example, a system with a 100 MHz clock has clock periods of 10 ns and clock pulses of 5 ns. A 1-3 ns glitch cannot be managed with conventional delay based glitch management circuits. The circuits and aspects discussed herein allow for proper glitch management having glitch durations which are significant compared to the timescales of the system.

In some embodiments, because of the glitch management circuitry, glitches in certain signals are suppressed or not propagated such that they do not propagate to sensitive system circuitry. Embodiments of systems using glitch management systems and techniques are discussed below.

Several illustrative embodiments are described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a schematic diagram of a signal transmission system 10 according to an embodiment. As discussed in further detail below, signal transmission system 10 transmits a signal from a first power domain to a second power domain. The first power domain includes power voltage VDD1 and ground voltage GND1. The second power domain includes power voltage VDD2 and ground voltage GND2. Because of glitch causing events understood to those of skill in the art, the voltages of either or both of power voltage VDD1 and ground voltage GND1 to temporarily change, or have a glitch, with respect to either or both of the voltages of power voltage VDD2 and ground voltage GND2.

A glitch may be caused, for example, by a glitch causing event directly affecting power voltage VDD1. For example, an ESD event, noise, or a power bounce may occur at the power voltage VDD1 node. A glitch may be caused, for example, by a glitch causing event directly affecting ground voltage GND1. For example, an ESD event, noise, or a ground bounce may occur at the ground voltage GND1 node.

A glitch may be caused, for example, by a glitch causing event directly affecting power voltage VDD2. For example, an ESD event, noise, or a power bounce may occur at the power voltage VDD2 node. A glitch may be caused, for example, by a glitch causing event directly affecting ground voltage GND2. For example, an ESD event, noise, or a ground bounce may occur at the ground voltage GND2 node.

In some embodiments, one or more coupling capacitors (not shown) may be placed across power voltage VDD1 and ground voltage GND1. The coupling capacitors function to reduce glitches occurring as a change in the voltage difference between power voltage VDD1 and ground voltage GND1.

In some embodiments, one or more coupling capacitors (not shown) may be placed across power voltage VDD2 and ground voltage GND2. The coupling capacitors function to reduce glitches occurring as a change in the voltage difference between power voltage VDD2 and ground voltage GND2.

In some embodiments, one or more coupling capacitors (not shown) may be placed across power voltage VDD1 and power voltage VDD2. The coupling capacitors function to reduce glitches occurring as a change in the voltage difference between power voltage VDD1 and power voltage VDD2.

In some embodiments, one or more coupling capacitors (not shown) may be placed across ground voltage GND1 and ground voltage GND2. The coupling capacitors function to reduce glitches occurring as a change in the voltage difference between ground voltage GND1 and ground voltage GND2.

In some embodiments, one or more coupling capacitors (not shown) may be placed across ground voltage GND1 and power voltage VDD2. The coupling capacitors function to reduce glitches occurring as a change in the voltage difference between power voltage GND1 and power voltage VDD2.

In some embodiments, one or more coupling capacitors (not shown) may be placed across power voltage VDD1 and ground voltage GND2. The coupling capacitors function to reduce glitches occurring as a change in the voltage difference between ground voltage VDD1 and ground voltage GND2.

In some embodiments having one or more coupling capacitors, the coupling capacitors reduce but do not eliminate glitches, such that the circuit techniques discussed herein advantageously prevent glitches from affecting sensitive circuitry.

Signal transmission system 10 is configured to receive an input signal at input terminal IN and to transmit a digital representation of the input signal as an output signal to output terminal OUT. In some embodiments, output terminal OUT is connected to one or more circuits which are sensitive to glitches which would occur in the output signal.

In some embodiments, the output signal represents a reset signal. For example, the input signal may be generated as a reset signal by a power management circuit, where the output signal may cause a microcontroller connected to output terminal OUT to reset. Accordingly, an unintended glitch in the output signal may cause the microcontroller to undesirably reset.

In some embodiments, the output signal represents an asynchronous signal, such as mode control signal. For example, the input signal may be generated as a mode control signal by a control circuit, where the output signal may cause a processing circuit connected to output terminal OUT to operate according to different modes. Accordingly, an unintended glitch in the output signal may cause the processing circuit to undesirably change modes.

In some embodiments, the output signal represents a clock signal. For example, the input signal may be generated as a clock signal by a clock generation circuit, where the output signal may cause a processing circuit connected to output terminal OUT to operate according to the clock signal. Accordingly, an unintended glitch in the output signal may cause the processing circuit to not function properly.

In some embodiments, the output signal represents another signal, where an unintended glitch in the output signal may cause a circuit connected to the output terminal OUT to not function properly.

Signal transmission system 10 includes differential signal generator 100 and glitch management circuit 200.

Differential signal generator 100 is configured to receive the input signal at input terminal IN. In addition, differential signal generator 100 is configured to generate a differential signal representing the input signal at differential nodes D and DN. For example, the input signal may transition between power voltage VDD1 and ground voltage GND1. In addition, the single ended signals at each of the differential nodes D and DN may transition between power voltage VDD1 and ground voltage GND1, such that the input signal being equal to the power voltage VDD1 causes the signal at differential node D to be equal to the power voltage VDD1 and causes the signal at differential node DN to be equal to the ground voltage GND1, and such that the input signal being equal to the ground voltage GND1 causes the signal at differential node D to be equal to the ground voltage GND1 and causes the signal at differential node DN to be equal to the power voltage VDD1.

In addition, glitch events may cause the signals at differential nodes D and DN to have glitches.

Glitch management circuit 200 is configured to receive the signals at differential nodes D and DN, and to generate the output signal at output terminal OUT based on the received signals, where the output signal may transition between power voltage VDD2 and ground voltage GND2. For example, in response to the signal at differential node D being equal to the power voltage VDD1 and the signal at differential node DN being equal to the ground voltage GND1, glitch management circuit 200 may be configured to cause the output signal at output terminal OUT to be equal to power voltage VDD2. Furthermore, in response to the signal at differential node D being equal to the ground voltage GND1 in the signal at differential node DN being able to the power voltage VDD1, glitch management circuit 200 may be configured to cause the output signal output terminal OUT to be equal to ground voltage GND2.

In addition, glitch management circuit 200 is configured to cause the output signal at output terminal OUT to persist or to be unaffected by the glitches occurring in the signals at differential nodes D and DN.

Figure 2:
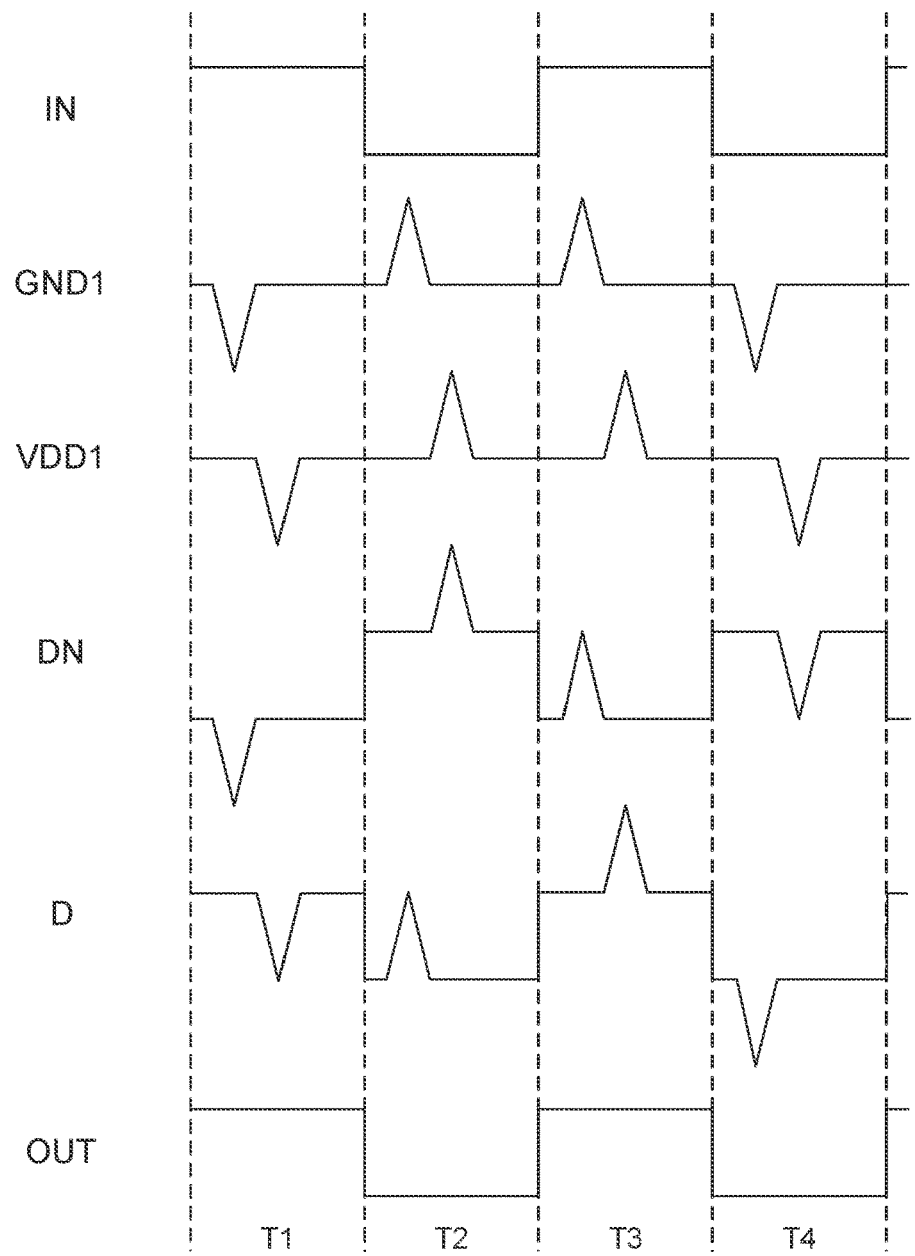
FIG. 2 illustrates a schematic representation of a set of waveforms illustrating operation of the signal transmission system of FIG. 1 according to an embodiment.

FIG. 2 illustrates a schematic representation of a set of waveforms illustrating operation of the signal transmission system 10 of FIG. 1 according to an embodiment.

During time T1, the input signal has a value equal to power voltage VDD1. In addition, during time T1, ground voltage GND1 experiences a negative glitch relative to either or both of power voltage VDD2 and ground voltage GND2. Furthermore, during time T1, power voltage VDD1 experiences a negative glitch relative to either or both of power voltage VDD2 and ground voltage GND2.

During time T1, as a result of the input signal having a voltage equal to power voltage VDD1, differential node DN has a signal equal to ground voltage GND1. In addition, because of the negative glitch of ground voltage GND1, during time T1, the signal at differential node DN also has a negative glitch corresponding with the negative glitch of ground voltage GND1.

During time T1, as a result of the input signal having a voltage equal to power voltage VDD1, differential node D has a signal equal to power voltage VDD1. In addition, because of the negative glitch of power voltage VDD1, during time T1, the signal at differential node D also has a negative glitch corresponding with the negative glitch of power voltage VDD1.

Furthermore, during time T1, as a result of the differential signal D having a voltage equal to power voltage VDD1 and the differential signal DN having a voltage equal to ground voltage GND1, the output signal at output terminal OUT has a voltage equal to power voltage VDD2. In addition, as shown, the negative glitches of differential nodes D and DN are suppressed, and do not affect the output signal.

Accordingly, during time T1, as a result of the input signal having a voltage equal to power voltage VDD1, the output signal at output terminal OUT has a voltage equal to power voltage VDD2, and the negative glitches of differential nodes D and DN are suppressed, and do not affect the output signal.

During time T2, the input signal has a value equal to ground voltage GND1. In addition, during time T2, ground voltage GND1 experiences a positive glitch relative to either or both of power voltage VDD2 and ground voltage GND2. Furthermore, during time T2, power voltage VDD1 experiences a positive glitch relative to either or both of power voltage VDD2 and ground voltage GND2.

During time T2, as a result of the input signal having a voltage equal to ground voltage GND1, differential node DN has a signal equal to power voltage VDD1. In addition, because of the positive glitch of power voltage VDD1, during time T2, the signal at differential node DN also has a positive glitch corresponding with the positive glitch of power voltage VDD1.

During time T2, as a result of the input signal having a voltage equal to ground voltage GND1, differential node D has a signal equal to ground voltage GND1. In addition, because of the positive glitch of ground voltage GND1, during time T2, the signal at differential node D also has a positive glitch corresponding with the positive glitch of ground voltage GND1.

Furthermore, during time T2, as a result of the input signal having a voltage equal to ground voltage GND1, the output signal at output terminal OUT has a voltage equal to ground voltage GND2. In addition, as shown, the positive glitches of differential nodes D and DN are suppressed, and do not affect the output signal.

During time T3, the input signal has a value equal to power voltage VDD1. In addition, during time T3, ground voltage GND1 experiences a positive glitch relative to either or both of power voltage VDD2 and ground voltage GND2. Furthermore, during time T3, power voltage VDD1 experiences a positive glitch relative to either or both of power voltage VDD2 and ground voltage GND2.

During time T3, as a result of the input signal having a voltage equal to power voltage VDD1, differential node DN has a signal equal to ground voltage GND1. In addition, because of the positive glitch of ground voltage GND1, during time T3, the signal at differential node DN also has a positive glitch corresponding with the positive glitch of ground voltage GND1.

During time T3, as a result of the input signal having a voltage equal to power voltage VDD1, differential node D has a signal equal to power voltage VDD1. In addition, because of the positive glitch of power voltage VDD1, during time T3, the signal at differential node D also has a positive glitch corresponding with the positive glitch of power voltage VDD1.

Furthermore, during time T3, as a result of the input signal having a voltage equal to power voltage VDD1, the output signal at output terminal OUT has a voltage equal to power voltage VDD2. In addition, as shown, the positive glitches of differential nodes D and DN are suppressed, and do not affect the output signal.

During time T4, the input signal has a value equal to ground voltage GND1. In addition, during time T4, ground voltage GND1 experiences a negative glitch relative to either or both of power voltage VDD2 and ground voltage GND2. Furthermore, during time T4, power voltage VDD1 experiences a negative glitch relative to either or both of power voltage VDD2 and ground voltage GND2.

During time T4, as a result of the input signal having a voltage equal to ground voltage GND1, differential node DN has a signal equal to power voltage VDD1. In addition, because of the negative glitch of power voltage VDD1, during time T4, the signal at differential node DN also has a negative glitch corresponding with the negative glitch of power voltage VDD1.

During time T4, as a result of the input signal having a voltage equal to ground voltage GND1, differential node D has a signal equal to ground voltage GND1. In addition, because of the negative glitch of ground voltage GND1, during time T4, the signal at differential node D also has a negative glitch corresponding with the negative glitch of ground voltage GND1.

Furthermore, during time T4, as a result of the input signal having a voltage equal to ground voltage GND1, the output signal at output terminal OUT has a voltage equal to ground voltage GND2. In addition, as shown, the negative glitches of differential nodes D and DN are suppressed, and do not affect the output signal.

Figure 3:
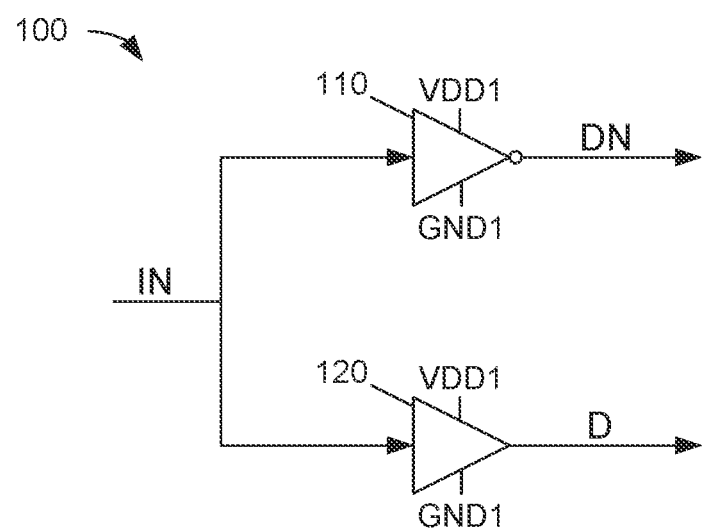
FIG. 3 illustrates a schematic diagram of a differential signal generator according to an embodiment.

FIG. 3 illustrates a schematic diagram of a differential signal generator 100 according to an embodiment. Differential signal generator 100 may be used as differential signal generator 100 of signal transmission system 10. In some embodiments, signal transmission system 10 uses another embodiment of a differential signal generator.

Differential signal generator 100 includes inverting circuit 110 and non-inverting circuit 120. Differential signal generator 100 is configured to receive an input signal at input terminal IN. In addition, differential signal generator 100 is configured to generate a differential signal representing the input signal at differential nodes D and DN. For example, the input signal may transition between power voltage VDD1 and ground voltage GND1. In addition, in response to the input signal being equal to the power voltage VDD1, non-inverting circuit 120 causes the signal at differential node D to be equal to the power voltage VDD1, and the inverting circuit 110 causes the signal at differential node DN to be equal to the ground voltage GND1. Furthermore, in response to the input signal being equal to the ground voltage GND1, non-inverting circuit 120 causes the signal at differential node D to be equal to the ground voltage GND1, and the inverting circuit 110 causes the signal at differential node DN to be equal to the power voltage VDD1.

Figure 4:
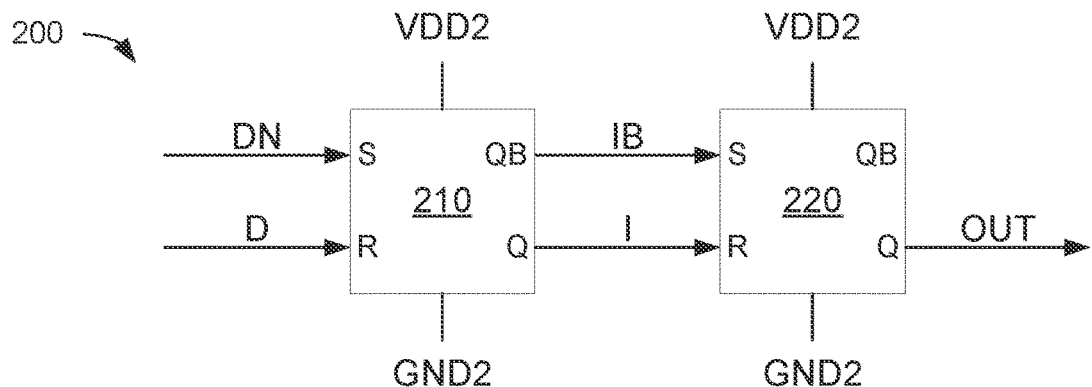
FIG. 4 illustrates a schematic diagram of a glitch management system according to an embodiment.

FIG. 4 illustrates a schematic diagram of a glitch management circuit 200 according to an embodiment. Glitch management circuit 200 may be used as glitch management circuit 200 of signal transmission system 10. In some embodiments, signal transmission system 10 uses another embodiment of a glitch management circuit.

Glitch management circuit 200 includes first SR (set/reset) latch 210 and second SR latch 220.

First SR latch 210 is configured to receive signals at differential nodes D and DN. In addition, first SR latch 210 is configured to generate intermediate signals at intermediate nodes I and IB based on the received signals. In this embodiment, the signal at differential node D being equal to power voltage VDD1 causes the voltage at intermediate node I to be equal to ground voltage GND2 and causes the voltage at intermediate node IB to be equal to power voltage VDD2 if the signal at differential node DN is equal to ground voltage GND1. Furthermore, in this embodiment, the signal at differential node DN being equal to power voltage VDD1 causes the voltage at intermediate node IB to be equal to ground voltage GND2, and causes the voltage at intermediate node I to be equal to power voltage VDD2 if the signal at differential node D is equal to ground voltage GND1.

Second SR latch 220 is configured to receive signals at intermediate nodes I and IB. In addition, second SR latch 220 is configured to generate an output signal at output terminal OUT based on the received signals. In this embodiment, the signal at intermediate node I being equal to power voltage VDD2 causes the voltage of the output signal to be equal to ground voltage GND2. Furthermore, in this embodiment, the signal at intermediate node IB being equal to power voltage VDD2 causes the voltage of the output signal to be equal to power voltage VDD2 if the signal at intermediate node I is equal to ground voltage GND2. In addition, glitches in differential nodes D and DN are suppressed, and do not affect the output signal.

Figure 5:
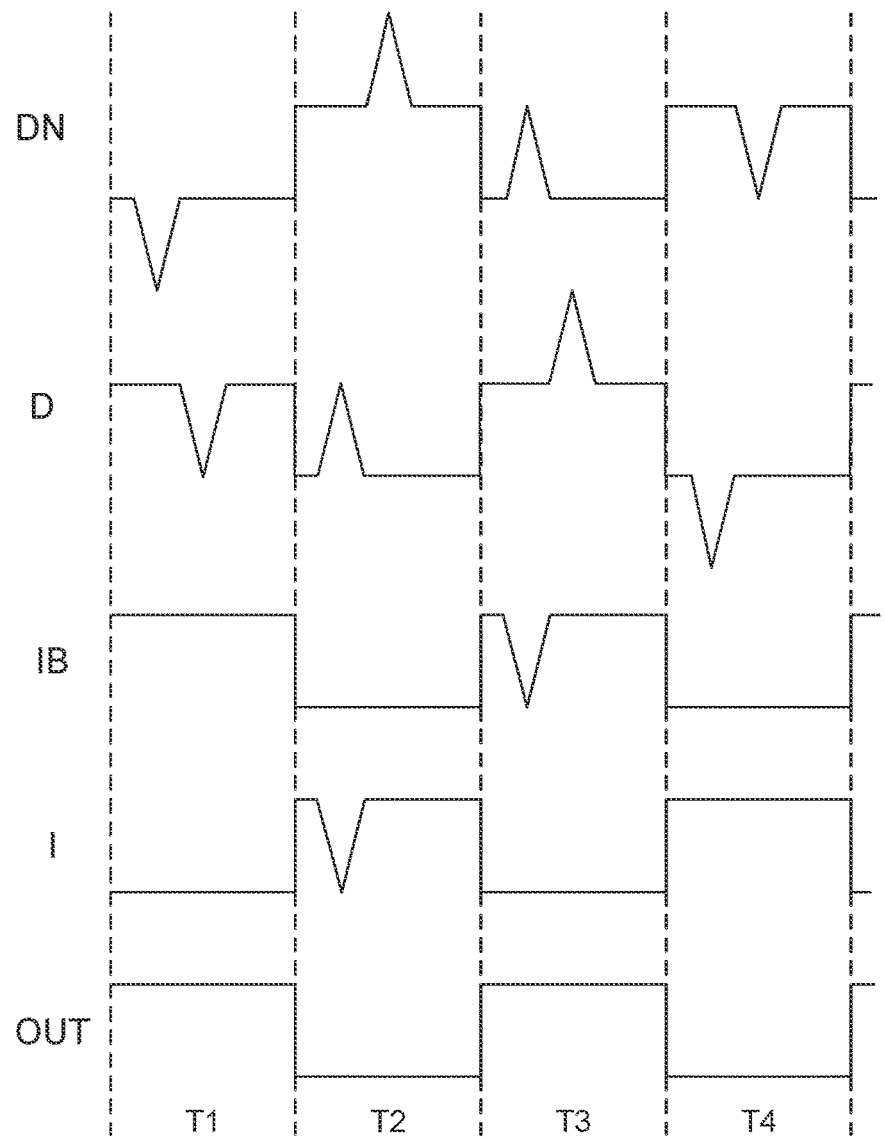
FIG. 5 illustrates a schematic representation of a set of waveforms illustrating operation of the glitch management system of FIG. 4 according to an embodiment.

FIG. 5 illustrates a schematic representation of a set of waveforms illustrating operation of the glitch management system 200 of FIG. 4 according to an embodiment.

During time T1, differential node DN has a signal equal to ground voltage GND1. In addition, during time T1, the signal at differential node DN also has a negative glitch.

During time T1, differential node D has a signal equal to power voltage VDD1. In addition, during time T1, the signal at differential node D also has a negative glitch.

During time T1, as a result of differential node D having a voltage equal to power voltage VDD1, intermediate node IB has a voltage equal to power voltage VDD2. The negative glitch of differential node DN does not disturb the voltage of intermediate node IB because the voltage of intermediate node IB does not change in response to the voltage of differential node DN being less than a threshold. The negative glitch of differential node D does not disturb the voltage of intermediate node IB because the voltage of intermediate node IB does not change in response to the voltage of differential node D being less than a threshold. Instead, the voltage of intermediate node IB would change in response to the voltage of differential node DN becoming greater than a threshold.

During time T1, as a result of differential node D having a voltage equal to power voltage VDD1, intermediate node I has a voltage equal to ground voltage GND2. The negative glitch of differential node DN does not disturb the voltage of intermediate node I because the voltage of intermediate node I does not change in response to the voltage of differential node DN being less than a threshold. The negative glitch of differential node D does not disturb the voltage of intermediate node I because the voltage of intermediate node I does not change in response to the voltage of differential node D being less than a threshold. Instead, the voltage of intermediate node I would change in response to the voltage of differential node DN becoming greater than a threshold while the voltage of differential node D is less than a threshold.

Furthermore, during time T1, as a result of the intermediate node IB having a voltage equal to power voltage VDD2, the output signal at output terminal OUT has a voltage equal to power voltage VDD2.

During time T2, differential node DN has a signal equal to power voltage VDD1.

In addition, during time T2, the signal at differential node DN also has a positive glitch.

During time T2, differential node D has a signal equal to ground voltage GND1. In addition, during time T2, the signal at differential node D also has a positive glitch.

During time T2, as a result of differential node DN having a voltage equal to power voltage VDD1, intermediate node IB has a voltage equal to ground voltage GND2. The positive glitch of differential node DN does not disturb the voltage of intermediate node IB because the voltage of intermediate node IB does not change in response to the voltage of differential node DN being greater than the voltage of power voltage VDD2. The positive glitch of differential node D does not disturb the voltage of intermediate node IB because the voltage of intermediate node IB does not change in response to the voltage of differential node D being greater than a threshold while the voltage of differential node DN is greater than the threshold. Instead, the voltage of intermediate node IB would change in response to the voltage of differential node D becoming greater than a threshold while the voltage of differential node DN is less than a threshold.

During time T2, as a result of differential node DN having a voltage equal to power voltage VDD1, intermediate node I has a voltage equal to power voltage VDD2. The positive glitch of differential node DN does not disturb the voltage of intermediate node I because the voltage of intermediate node I does not change in response to the voltage of differential node DN being greater than the voltage of power voltage VDD2. The positive glitch of differential node D does disturb the voltage of intermediate node I because the voltage of intermediate node I changes in response to the voltage of differential node D being greater than a threshold while the voltage of differential node DN is greater than the threshold.

Furthermore, during time T2, as a result of the intermediate node I having a voltage equal to power voltage VDD2, the output signal at output terminal OUT has a voltage equal to ground voltage GND2.

During time T3, differential node DN has a signal equal to ground voltage GND1. In addition, during time T3, the signal at differential node DN also has a positive glitch.

During time T3, differential node D has a signal equal to power voltage VDD1. In addition, during time T3, the signal at differential node D also has a positive glitch.

During time T3, as a result of differential node D having a voltage equal to power voltage VDD1, intermediate node IB has a voltage equal to power voltage VDD2. The positive glitch of differential node DN disturbs the voltage of intermediate node IB because the voltage of intermediate node IB changes in response to the voltage of differential node DN being greater than a threshold. The positive glitch of differential node D does not disturb the voltage of intermediate node IB because the voltage of intermediate node IB does not change in response to the voltage of differential node D being greater than the power voltage VDD2.

During time T3, as a result of differential node D having a voltage equal to power voltage VDD1, intermediate node I has a voltage equal to ground voltage GND2. The positive glitch of differential node DN does not disturb the voltage of intermediate node I because the voltage of intermediate node I does not change in response to the voltage of differential node DN being greater than a threshold while the voltage of differential node D is greater than the threshold. The positive glitch of differential node D does not disturb the voltage of intermediate node I because the voltage of intermediate node I does not change in response to the voltage of differential node DN being greater than a threshold while the voltage of differential node D is greater than the threshold.

Furthermore, during time T3, as a result of the intermediate node IB having a voltage equal to power voltage VDD2, the output signal at output terminal OUT has a voltage equal to power voltage VDD2.

During time T4, differential node DN has a signal equal to power voltage VDD1. In addition, during time T4, the signal at differential node DN also has a negative glitch.

During time T4, differential node D has a signal equal to ground voltage GND1. In addition, during time T4, the signal at differential node D also has a negative glitch.

During time T4, as a result of differential node DN having a voltage equal to power voltage VDD1, intermediate node IB has a voltage equal to ground voltage GND2. The negative glitch of differential node DN does not disturb the voltage of intermediate node IB because the voltage of intermediate node IB does not change in response to the voltage of differential node DN being less than a threshold. The negative glitch of differential node D does not disturb the voltage of intermediate node IB because the voltage of intermediate node IB does not change in response to the voltage of differential node D being less than a threshold.

During time T4, as a result of differential node DN having a voltage equal to power voltage VDD1, intermediate node I has a voltage equal to power voltage VDD2. The negative glitch of differential node DN does not disturb the voltage of intermediate node I because the voltage of intermediate node I does not change in response to the voltage of differential node DN being less than a threshold. The negative glitch of differential node D does not disturb the voltage of intermediate node I because the voltage of intermediate node I does not change in response to the voltage of differential node D being less than a threshold. Instead, the voltage of intermediate node I would change in response to the voltage of differential node DN becoming greater than a threshold while the voltage of differential node D is less than a threshold.

Furthermore, during time T4, as a result of the intermediate node I having a voltage equal to power voltage VDD2, the output signal at output terminal OUT has a voltage equal to ground voltage GND2.

Figure 6:
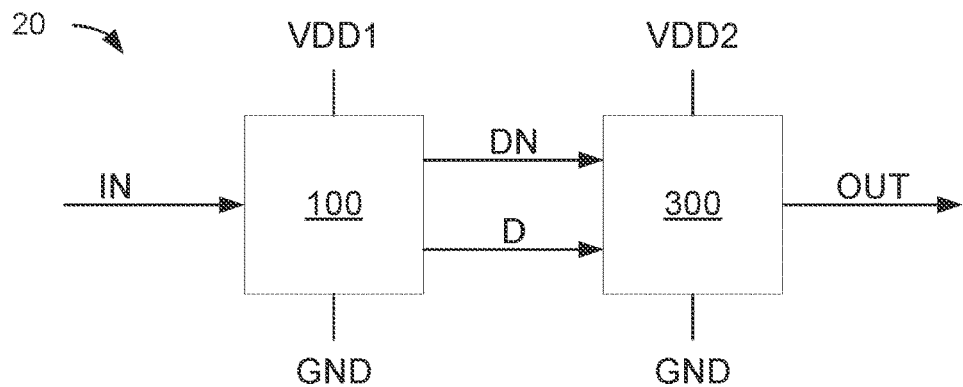
FIG. 6 illustrates a schematic diagram of a signal transmission system according to an embodiment.

FIG. 6 illustrates a schematic diagram of a signal transmission system 20 according to an embodiment. As discussed in further detail below, signal transmission system 20 transmits a signal from a first power domain to a second power domain. The first power domain includes power voltage VDD1 and ground voltage GND. The second power domain includes power voltage VDD2 and ground voltage GND. Because of glitch causing events understood to those of skill in the art, the voltage of power voltage VDD1 to temporarily change, or have a glitch, with respect to either or both of the voltages of power voltage VDD2 and the ground voltage GND.

A glitch may be caused, for example, by a glitch causing event directly affecting power voltage VDD1. For example, an ESD event, noise, or a power bounce may occur at the power voltage VDD1 node. A glitch may be caused, for example, by a glitch causing event directly affecting power voltage VDD2. For example, an ESD event, noise, or a power bounce may occur at the power voltage VDD2 node.

In some embodiments, one or more coupling capacitors (not shown) may be placed across power voltage VDD1 and ground voltage GND. The coupling capacitors function to reduce glitches occurring as a change in the voltage difference between power voltage VDD1 and ground voltage GND.

In some embodiments, one or more coupling capacitors (not shown) may be placed across power voltage VDD2 and ground voltage GND. The coupling capacitors function to reduce glitches occurring as a change in the voltage difference between power voltage VDD2 and ground voltage GND.

In some embodiments, one or more coupling capacitors (not shown) may be placed across power voltage VDD1 and power voltage VDD2. The coupling capacitors function to reduce glitches occurring as a change in the voltage difference between power voltage VDD1 and power voltage VDD2.

In some embodiments having one or more coupling capacitors, the coupling capacitors reduce but do not eliminate glitches, such that the circuit techniques discussed herein advantageously prevent glitches from affecting sensitive circuitry.

Signal transmission system 20 is configured to receive an input signal at input terminal IN and to transmit a digital representation of the input signal as an output signal to output terminal OUT. In some embodiments, output terminal OUT is connected to one or more circuits which are sensitive to glitches which would occur in the output signal.

In some embodiments, the output signal represents a reset signal. For example, the input signal may be generated as a reset signal by a power management circuit, where the output signal may cause a microcontroller connected to output terminal OUT to reset. Accordingly, an unintended glitch in the output signal may cause the microcontroller to undesirably reset.

In some embodiments, the output signal represents an asynchronous signal, such as mode control signal. For example, the input signal may be generated as a mode control signal by a control circuit, where the output signal may cause a processing circuit connected to output terminal OUT to operate according to different modes. Accordingly, an unintended glitch in the output signal may cause the processing circuit to undesirably change modes.

In some embodiments, the output signal represents a clock signal. For example, the input signal may be generated as a clock signal by a clock generation circuit, where the output signal may cause a processing circuit connected to output terminal OUT to operate according to the clock signal. Accordingly, an unintended glitch in the output signal may cause the processing circuit to not function properly.

In some embodiments, the output signal represents another signal, where an unintended glitch in the output signal may cause a circuit connected to the output terminal OUT to not function properly.

Signal transmission system 20 includes differential signal generator 100 and glitch management circuit 300.

Differential signal generator 100 is similar or identical to differential signal generator 100 of FIG. 1. Accordingly, differential signal generator 100 is configured to receive the input signal at input terminal IN. In addition, differential signal generator 100 is configured to generate a differential signal representing the input signal at differential nodes D and DN. In addition, glitch events may cause the signals at differential nodes D and DN to have glitches.

Glitch management circuit 300 is configured to receive the signals at differential nodes D and DN, and to generate the output signal at output terminal OUT based on the received signals, where the output signal may transition between power voltage VDD2 and ground voltage GND2. For example, in response to the signal at differential node D being equal to the power voltage VDD1 and the signal at differential node DN being equal to the ground voltage GND1, glitch management circuit 300 may be configured to cause the output signal at output terminal OUT to be equal to power voltage VDD2. Furthermore, in response to the signal at differential node D being equal to the ground voltage GND1 in the signal at differential node DN being able to the power voltage VDD1, glitch management circuit 300 may be configured to cause the output signal output terminal OUT to be equal to ground voltage GND2.

In addition, glitch management circuit 300 is configured to cause the output signal at output terminal OUT to persist or to be unaffected by the glitches occurring in the signals at differential nodes D and DN.

Figure 7:
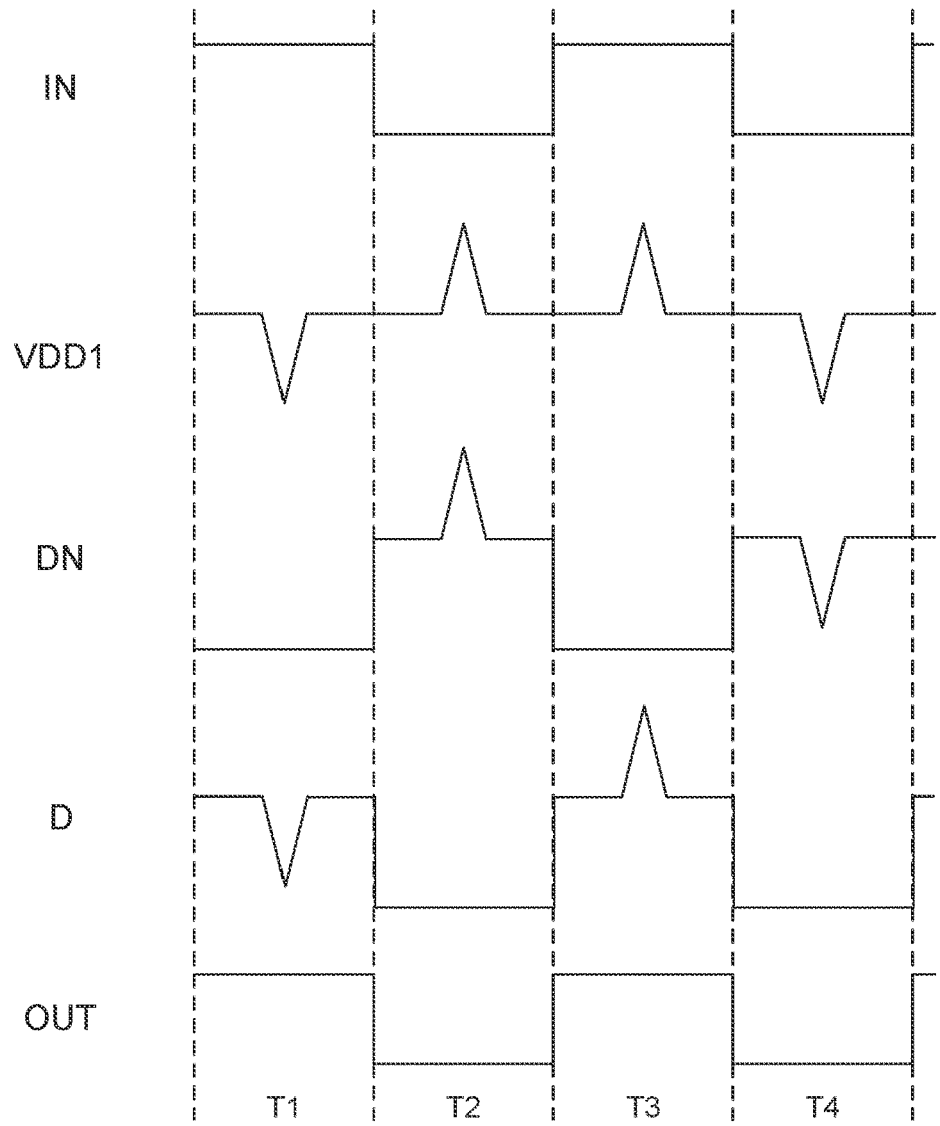
FIG. 7 illustrates a schematic representation of a set of waveforms illustrating operation of the signal transmission system of FIG. 6 according to an embodiment.

FIG. 7 illustrates a schematic representation of a set of waveforms illustrating operation of the signal transmission system 20 of FIG. 6 according to an embodiment.

During time T1, the input signal has a value equal to power voltage VDD1. In addition, during time T1, power voltage VDD1 experiences a negative glitch relative to either or both of power voltage VDD2 and ground voltage GND.

During time T1, as a result of the input signal having a voltage equal to power voltage VDD1, differential node DN has a signal equal to ground voltage GND. In addition, as a result of the input signal having a voltage equal to power voltage VDD1, differential node D has a signal equal to power voltage VDD1. Furthermore, because of the negative glitch of power voltage VDD1, during time T1, the signal at differential node D also has a negative glitch corresponding with the negative glitch of power voltage VDD1.

Furthermore, during time T1, as a result of the differential signal D having a voltage equal to power voltage VDD1 and the differential signal DN having a voltage equal to ground voltage GND, the output signal at output terminal OUT has a voltage equal to power voltage VDD2. In addition, as shown, the negative glitch of differential node D is suppressed, and does not affect the output signal.

Accordingly, during time T1, as a result of the input signal having a voltage equal to power voltage VDD1, the output signal at output terminal OUT has a voltage equal to power voltage VDD2, and the negative glitch of differential node D is suppressed, and does not affect the output signal.

During time T2, the input signal has a value equal to ground voltage GND. In addition, during time T2, power voltage VDD1 experiences a positive glitch relative to either or both of power voltage VDD2 and ground voltage GND.

During time T2, as a result of the input signal having a voltage equal to ground voltage GND, differential node DN has a signal equal to power voltage VDD1. In addition, because of the positive glitch of power voltage VDD1, during time T2, the signal at differential node DN also has a positive glitch corresponding with the positive glitch of power voltage VDD1.

During time T2, as a result of the input signal having a voltage equal to ground voltage GND, differential node D has a signal equal to ground voltage GND. In addition, the positive glitch of power voltage VDD1 does not affect the signal at differential node D.

Furthermore, during time T2, as a result of the differential signal D having a voltage equal to ground voltage GND and the differential signal DN having a voltage equal to power voltage VDD1, the output signal at output terminal OUT has a voltage equal to ground voltage GND2. In addition, as shown, the positive glitch of differential node DN is suppressed, and does not affect the output signal.

Accordingly, during time T2, as a result of the input signal having a voltage equal to ground voltage GND, the output signal at output terminal OUT has a voltage equal to ground voltage GND, and the positive glitch of differential node DN is suppressed, and does not affect the output signal.

During time T3, the input signal has a value equal to power voltage VDD1. In addition, during time T3, power voltage VDD1 experiences a positive glitch relative to either or both of power voltage VDD2 and ground voltage GND.

During time T3, as a result of the input signal having a voltage equal to power voltage VDD1, differential node DN has a signal equal to ground voltage GND. In addition, as a result of the input signal having a voltage equal to power voltage VDD1, differential node D has a signal equal to power voltage VDD1. Furthermore, because of the positive glitch of power voltage VDD1, during time T3, the signal at differential node D also has a positive glitch corresponding with the positive glitch of power voltage VDD1.

Furthermore, during time T3, as a result of the differential signal D having a voltage equal to power voltage VDD1 and the differential signal DN having a voltage equal to ground voltage GND, the output signal at output terminal OUT has a voltage equal to power voltage VDD2. In addition, as shown, the positive glitch of differential node D is suppressed, and does not affect the output signal.

Accordingly, during time T3, as a result of the input signal having a voltage equal to power voltage VDD1, the output signal at output terminal OUT has a voltage equal to power voltage VDD2, and the positive glitch of differential node D is suppressed, and does not affect the output signal.

During time T4, the input signal has a value equal to ground voltage GND. In addition, during time T4, power voltage VDD1 experiences a negative glitch relative to either or both of power voltage VDD2 and ground voltage GND.

During time T4, as a result of the input signal having a voltage equal to ground voltage GND, differential node DN has a signal equal to power voltage VDD1. In addition, because of the negative glitch of power voltage VDD1, during time T4, the signal at differential node DN also has a negative glitch corresponding with the negative glitch of power voltage VDD1.

During time T4, as a result of the input signal having a voltage equal to ground voltage GND, differential node D has a signal equal to ground voltage GND. In addition, the negative glitch of power voltage VDD1 does not affect the signal at differential node D.

Furthermore, during time T4, as a result of the differential signal D having a voltage equal to ground voltage GND and the differential signal DN having a voltage equal to power voltage VDD1, the output signal at output terminal OUT has a voltage equal to ground voltage GND2. In addition, as shown, the negative glitch of differential node DN is suppressed, and does not affect the output signal.

Accordingly, during time T4, as a result of the input signal having a voltage equal to ground voltage GND, the output signal at output terminal OUT has a voltage equal to ground voltage GND, and the negative glitch of differential node DN is suppressed, and does not affect the output signal.

Figure 8:
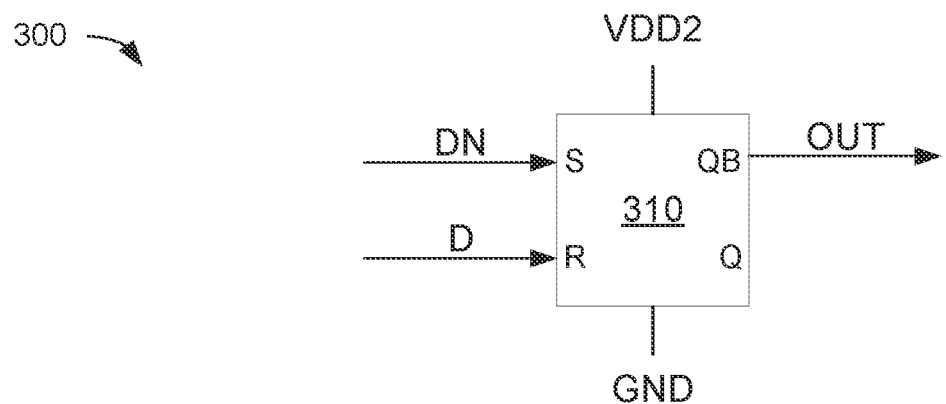
FIG. 8 illustrates a schematic diagram of a glitch management system according to an embodiment.

FIG. 8 illustrates a schematic diagram of a glitch management circuit 300 according to an embodiment. Glitch management circuit 300 may be used as glitch management circuit 300 of signal transmission system 20. In some embodiments, signal transmission system 20 uses another embodiment of a glitch management circuit.

Glitch management circuit 300 includes SR latch 310.

SR latch 310 is configured to receive signals at differential nodes D and DN. In addition, SR latch 310 is configured to generate an output signal at output terminal OUT based on the received signals. In this embodiment, the signal at differential node D being equal to power voltage VDD1 causes the voltage at output signal at output terminal OUT to be equal to ground voltage GND2. Furthermore, in this embodiment, the signal at differential node DN being equal to power voltage VDD1 causes the voltage at output signal at output terminal OUT to be equal to power voltage VDD2 if the signal at differential node D is equal to ground voltage GND1.

Figure 9:
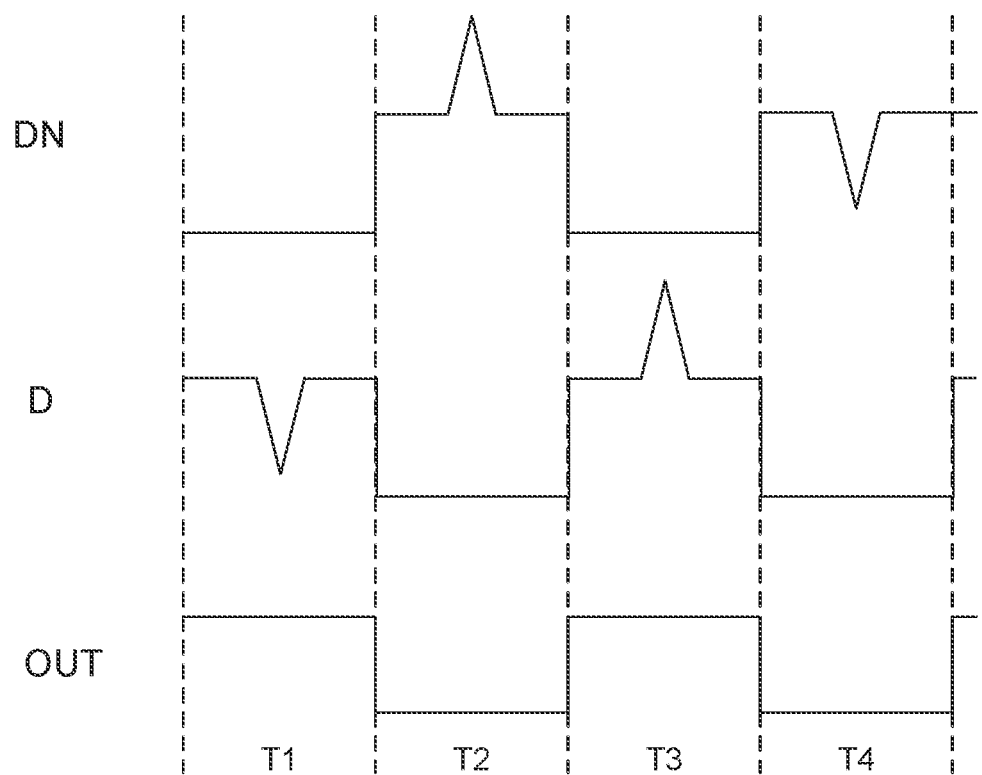
FIG. 9 illustrates a schematic representation of a set of waveforms illustrating operation of the glitch management system of FIG. 8 according to an embodiment.

FIG. 9 illustrates a schematic representation of a set of waveforms illustrating operation of the glitch management system 300 of FIG. 8 according to an embodiment.

During time T1, differential node DN has a signal equal to ground voltage GND.

During time T1, differential node D has a signal equal to power voltage VDD1. In addition, during time T1, the signal at differential node D also has a negative glitch.

During time T1, as a result of differential node D having a voltage equal to power voltage VDD1, output signal at output terminal OUT has a voltage equal to power voltage VDD2. The negative glitch of differential node D does not disturb the voltage of output signal at output terminal OUT because the voltage of output signal at output terminal OUT does not change in response to the voltage of differential node D being less than a threshold. Instead, the voltage of output signal at output terminal OUT would change in response to the voltage of differential node DN becoming greater than a threshold.

During time T2, differential node DN has a signal equal to power voltage VDD1. In addition, during time T2, the signal at differential node DN also has a positive glitch.

During time T2, differential node D has a signal equal to ground voltage GND.

During time T2, as a result of differential node DN having a voltage equal to power voltage VDD1, the output signal at output terminal OUT has a voltage equal to ground voltage GND. The positive glitch of differential node DN does not disturb the voltage of output signal at output terminal OUT because the voltage of output signal at output terminal OUT does not change in response to the voltage of differential node DN being greater than the voltage of power voltage VDD2. Instead, the voltage of output signal at output terminal OUT would change in response to the voltage of differential node D becoming greater than a threshold while the voltage of differential node DN is less than a threshold.

During time T3, differential node DN has a signal equal to ground voltage GND.

During time T3, differential node D has a signal equal to power voltage VDD1. In addition, during time T3, the signal at differential node D also has a positive glitch.

During time T3, as a result of differential node D having a voltage equal to power voltage VDD1, the output signal at output terminal OUT has a voltage equal to power voltage VDD2. The positive glitch of differential node D does not disturb the voltage of output signal at output terminal OUT because the voltage of output signal at output terminal OUT does not change in response to the voltage of differential node D being greater than the power voltage VDD2.

During time T4, differential node DN has a signal equal to power voltage VDD1. In addition, during time T4, the signal at differential node DN also has a negative glitch.

During time T4, differential node D has a signal equal to ground voltage GND.

During time T4, as a result of differential node DN having a voltage equal to power voltage VDD1, the output signal at output terminal OUT has a voltage equal to ground voltage GND. The negative glitch of differential node DN does not disturb the voltage of output signal at output terminal OUT because the voltage of output signal at output terminal OUT does not change in response to the voltage of differential node DN being less than a threshold.

Figure 10:
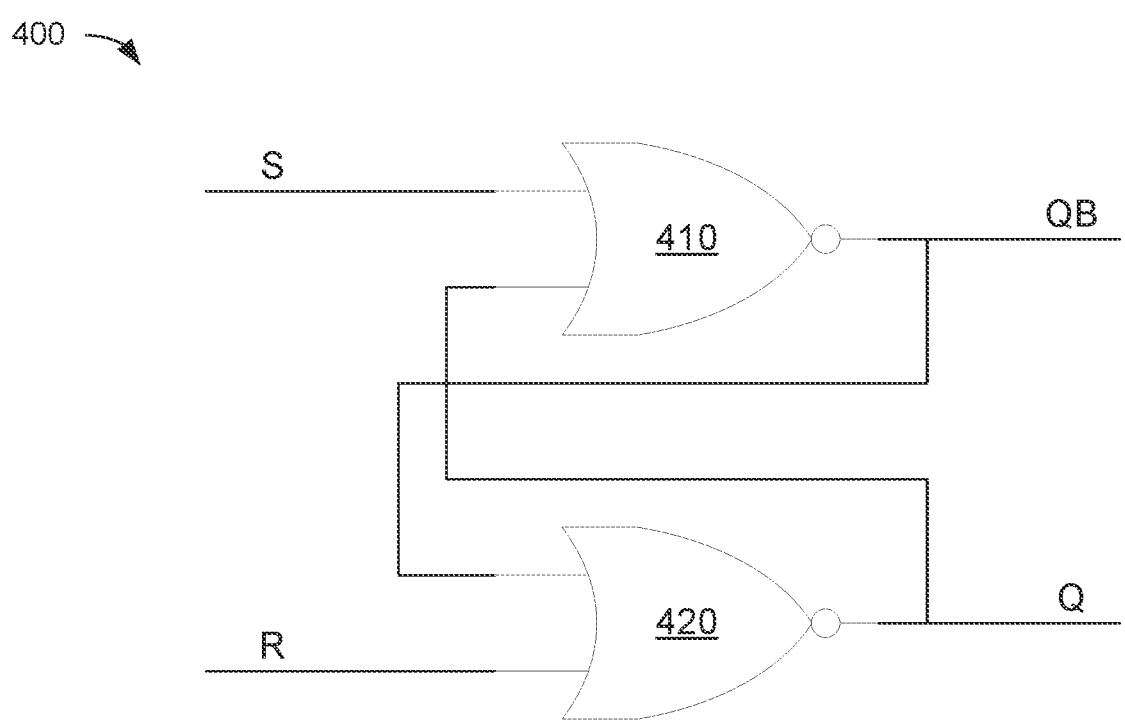
FIG. 10 illustrates a schematic diagram of a latch according to an embodiment.

FIG. 10 illustrates a schematic diagram of an SR latch 400 according to an embodiment. SR latch 400 may be used as each of first and second SR latches 210 and 220 of glitch management circuit 200. In some embodiments, glitch management circuit 200 uses another embodiment of an SR latch. SR latch 400 may be used as SR latch of glitch management circuit 300. In some embodiments, glitch management circuit 300 uses another embodiment of an SR latch.

SR latch 400 includes first and second NOR gates 410 and 420. As understood by those of skill in the art, SR latch 400 operates according to standard digital logic principles. Accordingly, the voltage input node S being high causes output node QB to be low, and the voltage input node R being high causes output node Q to be low. In addition, the voltage of input node S being high and the voltage of input node R being low causes the output node Q to be high, and causes the output node QB to be low. Furthermore, the voltage of input node S being low and the voltage of input node R being high causes the output node Q to be low, and causes the output node QB to be high. Also, the voltage of input node S being low and the voltage of input node R being low causes the output nodes Q and QB to maintain their output states.

The embodiments and implementations discussed herein are not meant to be an exhaustive explanation of the principles and aspects of this disclosure. Accordingly, using principles to those known of skill in the art, alternative embodiments may be implemented. For example, alternative circuit embodiments may be implemented using one or more inverters or buffers to condition the various signals. In some embodiments, different latch architectures are used along with corresponding signal polarity management using one or more inverters. For example, a cross coupled NAND SR latch may be used instead of the illustrated NOR SR latch.

In some embodiments, power voltage VDD1 may be equal or about equal or substantially equal to power voltage VDD2. In some embodiments, power voltage VDD1 is not equal to power voltage VDD2. In some embodiments, power voltage VDD1 is greater than power voltage VDD2. In some embodiments, power voltage VDD2 is greater than power voltage VDD1.

In some embodiments, ground voltage GND1 may be equal or about equal or substantially equal to ground voltage GND2. In some embodiments, ground voltage GND1 is not equal to ground voltage GND2. In some embodiments, ground voltage GND1 is greater than ground voltage GND2. In some embodiments, ground voltage GND2 is greater than ground voltage GND1.

In some embodiments, the voltage difference power voltage VDD1 and ground voltage GND1 may be equal or about equal or substantially equal to the voltage difference between power voltage VDD2 and ground voltage GND2. In some embodiments, the voltage difference power voltage VDD1 and ground voltage GND1 is not equal to the voltage difference between power voltage VDD2 and ground voltage GND2. In some embodiments, the voltage difference power voltage VDD1 and ground voltage GND1 is greater than the voltage difference between power voltage VDD2 and ground voltage GND2. In some embodiments, the voltage difference power voltage VDD1 and ground voltage GND1 is less than the voltage difference between power voltage VDD2 and ground voltage GND2.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. An electronic system, comprising:
 a differential signal generator comprising one or more differential signal generator components collectively configured to receive an input signal and to generate first and second single ended signals based on the input signal, wherein the first and second single ended signals have opposite polarities, wherein the input signal transitions between a first power voltage and a first ground voltage, and wherein each of the first and second single ended signals transition between the first power voltage and the first ground voltage; and
 a glitch management circuit comprising one or more glitch management components collectively configured to receive the first and second single ended signals, and to generate an output signal based on the first and second single ended signals, wherein the output signal transitions between a second power voltage and a second ground voltage, wherein the glitch management circuit comprises:
  a first latch configured to receive the first and second single ended signals, and to generate first and second intermediate signals based on the first and second single ended signals, wherein the first and second intermediate signals each transition between the second power voltage and the second ground voltage, and
  a second latch configured to receive the first and second intermediate signals, and to generate the output signal based on the first and second intermediate signals,
 wherein the first latch comprises a first SR (set/reset) latch, and wherein the second latch comprises a second SR latch.

2. The electronic system of claim 1, wherein at least one of:
   A) the first single ended signal has a first signal glitch as a result of either or both of the first power voltage and the first ground voltage changing with respect to either or both of the second power voltage and the second ground voltage, and wherein the glitch management circuit is configured to suppress the first signal glitch; and
   B) the second single ended signal has a second signal glitch as a result of either or both of the first power voltage and the first ground voltage changing with respect to either or both of the second power voltage and the second ground voltage, and wherein the glitch management circuit is configured to suppress the second signal glitch.

3. The electronic system of claim 1, wherein at least one of:
   A) the first single ended signal has first and second signal glitches as a result of either or both of the first power voltage and the first ground voltage changing with respect to either or both of the second power voltage and the second ground voltage, wherein the first and second signal glitches have opposite polarity, and wherein the glitch management circuit is configured to suppress the first and second signal glitches, and
   B) the second single ended signal has third and fourth signal glitches as a result of either or both of the first power voltage and the first ground voltage changing with respect to either or both of the second power voltage and the second ground voltage, wherein the third and fourth signal glitches have opposite polarity, and wherein the glitch management circuit is configured to suppress the third and fourth signal glitches.

4. The electronic system of claim 3, wherein the first latch is configured to receive the first, second, third, and fourth signal glitches, to propagate the first signal glitch to the second intermediate signal, to propagate the third signal glitch to the first intermediate signal, and to suppress the second and fourth signal glitches so that the second and fourth signal glitches do not propagate to the first and second intermediate signals, wherein the first and third signal glitches have the same first polarity, and wherein the second and fourth signal glitches have the same second polarity.

5. The electronic system of claim 4, wherein the second latch is configured to receive the propagated first and third signal glitches from the first latch, and to suppress the propagated first and third signal glitches so that the propagated first and third signal glitches do not further propagate to the output signal.

6. The electronic system of claim 1, wherein the differential signal generator comprises:
   an inverting signal path configured to receive the input signal and to generate the first single ended signal based on the input signal, wherein the first single ended signal and the input signal have opposite polarities; and
   a non-inverting signal path configured to receive the input signal and to generate the second single ended signal based on the input signal, wherein the second single ended signal and the input signal have the same polarity.

7. A method of using an electronic system, the electronic system comprising a differential signal generator and a glitch management circuit, the method comprising:
   with one or more differential signal generator components of the differential signal generator, receiving an input signal;
   with the differential signal generator components, generating first and second single ended signals based on the input signal, wherein the first and second single ended signals have opposite polarities, wherein the input signal transitions between a first power voltage and a first ground voltage, and wherein each of the first and second single ended signals transition between the first power voltage and the first ground voltage;
   with one or more glitch management components, receiving the first and second single ended signals; and
   with the glitch management components, generating an output signal based on the first and second single ended signals, wherein the output signal transitions between a second power voltage and a second ground voltage, wherein the glitch management circuit comprises:
      a first latch configured to receive the first and second single ended signals, and to generate first and second intermediate signals based on the first and second single ended signals, wherein the first and second intermediate signals each transition between the second power voltage and the second ground voltage, and
      a second latch configured to receive the first and second intermediate signals, and to generate the output signal based on the first and second intermediate signals,
   wherein the first latch comprises a first SR (set/reset) latch, and wherein the second latch comprises a second SR latch.

8. The method of claim 7, wherein at least one of:
   A) the first single ended signal has a first signal glitch as a result of either or both of the first power voltage and the first ground voltage changing with respect to either or both of the second power voltage and the second ground voltage, and wherein the method further includes, with the glitch management circuit suppressing the first signal glitch,
   B) the second single ended signal has a second signal glitch as a result of either or both of the first power voltage and the first ground voltage changing with respect to either or both of the second power voltage and the second ground voltage, and wherein the method further includes, with the glitch management circuit suppressing the second signal glitch.

9. The method of claim 7, wherein at least one of:
   A) the first single ended signal has first and second signal glitches as a result of either or both of the first power voltage and the first ground voltage changing with respect to either or both of the second power voltage and the second ground voltage, wherein the first and second signal glitches have opposite polarity, and wherein the method further includes, with the glitch management circuit suppressing the first and second signal glitches, and
   B) the second single ended signal has third and fourth signal glitches as a result of either or both of the first power voltage and the first ground voltage changing with respect to either or both of the second power voltage and the second ground voltage, wherein the third and fourth signal glitches have opposite polarity, and wherein the method further includes, with the glitch management circuit suppressing the third and fourth signal glitches.

10. The method of claim 9, wherein the first latch is configured to receive the first, second, third, and fourth signal glitches, to propagate the first signal glitch to the second intermediate signal, to propagate the third signal glitch to the first intermediate signal, and to suppress the second and fourth signal glitches so that the second and fourth signal glitches do not propagate to the first and second intermediate signals, wherein the first and third signal glitches have the same first polarity, and wherein the second and fourth signal glitches have the same second polarity.

11. The method of claim 10, wherein the second latch is configured to receive the propagated first and third signal glitches from the first latch, and to suppress the propagated first and third signal glitches so that the propagated first and third signal glitches do not further propagate to the output signal.

12. The method of claim 7, wherein the differential signal generator comprises:
 an inverting signal path configured to receive the input signal and to generate the first single ended signal based on the input signal, wherein the first single ended signal and the input signal have opposite polarities; and
 a non-inverting signal path configured to receive the input signal and to generate the second single ended signal based on the input signal, wherein the second single ended signal and the input signal have the same polarity.

13. An electronic system, comprising:
 a differential signal generator comprising one or more differential signal generator components collectively configured to receive an input signal and to generate first and second single ended signals based on the input signal, wherein the first and second single ended signals have opposite polarities, wherein the input signal transitions between a first power voltage and a first ground voltage, and wherein each of the first and second single ended signals transition between the first power voltage and the first ground voltage; and
 a glitch management circuit comprising one or more glitch management components collectively configured to receive the first and second single ended signals, and to generate an output signal based on the first and second single ended signals, wherein the output signal transitions between a second power voltage and a second ground voltage, wherein the glitch management circuit comprises:
  a first latch configured to receive the first and second single ended signals, and to generate first and second intermediate signals based on the first and second single ended signals, wherein the first and second intermediate signals each transition between the second power voltage and the second ground voltage, and
  a second latch configured to receive the first and second intermediate signals, and to generate the output signal based on the first and second intermediate signals,
 wherein at least one of:
  A) the first single ended signal has first and second signal glitches as a result of either or both of the first power voltage and the first ground voltage changing with respect to either or both of the second power voltage and the second ground voltage, wherein the first and second signal glitches have opposite polarity, and wherein the glitch management circuit is configured to suppress the first and second signal glitches, and
  B) the second single ended signal has third and fourth signal glitches as a result of either or both of the first power voltage and the first ground voltage changing with respect to either or both of the second power voltage and the second ground voltage, wherein the third and fourth signal glitches have opposite polarity, and wherein the glitch management circuit is configured to suppress the third and fourth signal glitches, and
 wherein the first latch is configured to receive the first, second, third, and fourth signal glitches, to propagate the first signal glitch to the second intermediate signal, to propagate the third signal glitch to the first intermediate signal, and to suppress the second and fourth signal glitches so that the second and fourth signal glitches do not propagate to the first and second intermediate signals, wherein the first and third signal glitches have the same first polarity, and wherein the second and fourth signal glitches have the same second polarity.

14. The electronic system of claim 13, wherein the second latch is configured to receive the propagated first and third signal glitches from the first latch, and to suppress the propagated first and third signal glitches so that the propagated first and third signal glitches do not further propagate to the output signal.

15. The electronic system of claim 13, wherein the differential signal generator comprises:
 an inverting signal path configured to receive the input signal and to generate the first single ended signal based on the input signal, wherein the first single ended signal and the input signal have opposite polarities; and
 a non-inverting signal path configured to receive the input signal and to generate the second single ended signal based on the input signal, wherein the second single ended signal and the input signal have the same polarity.

16. The electronic system of claim 13, wherein the first and second latches comprise a common type of latch.

17. A method of using an electronic system, the electronic system comprising a differential signal generator and a glitch management circuit, the method comprising:
 with one or more differential signal generator components of the differential signal generator, receiving an input signal;
 with the differential signal generator components, generating first and second single ended signals based on the input signal, wherein the first and second single ended signals have opposite polarities, wherein the input signal transitions between a first power voltage and a first ground voltage, and wherein each of the first and second single ended signals transition between the first power voltage and the first ground voltage;
 with one or more glitch management components, receiving the first and second single ended signals; and
 with the glitch management components, generating an output signal based on the first and second single ended signals, wherein the output signal transitions between a second power voltage and a second ground voltage, wherein the glitch management circuit comprises:
  a first latch configured to receive the first and second single ended signals, and to generate first and second intermediate signals based on the first and second single ended signals, wherein the first and second intermediate signals each transition between the second power voltage and the second ground voltage, and
  a second latch configured to receive the first and second intermediate signals, and to generate the output signal based on the first and second intermediate signals, wherein at least one of:
- A) the first single ended signal has first and second signal glitches as a result of either or both of the first power voltage and the first ground voltage changing with respect to either or both of the second power voltage and the second ground voltage, wherein the first and second signal glitches have opposite polarity, and wherein the method further includes, with the glitch management circuit suppressing the first and second signal glitches, and
- B) the second single ended signal has third and fourth signal glitches as a result of either or both of the first power voltage and the first ground voltage changing with respect to either or both of the second power voltage and the second ground voltage, wherein the third and fourth signal glitches have opposite polarity, and wherein the method further includes, with the glitch management circuit suppressing the third and fourth signal glitches, and wherein the first latch is configured to receive the first, second, third, and fourth signal glitches, to propagate the first signal glitch to the second intermediate signal, to propagate the third signal glitch to the first intermediate signal, and to suppress the second and fourth signal glitches so that the second and fourth signal glitches do not propagate to the first and second intermediate signals, wherein the first and third signal glitches have the same first polarity, and wherein the second and fourth signal glitches have the same second polarity.

18. The method of claim 17, wherein the second latch is configured to receive the propagated first and third signal glitches from the first latch, and to suppress the propagated first and third signal glitches so that the propagated first and third signal glitches do not further propagate to the output signal.

19. The method of claim 17, wherein the differential signal generator comprises:
- an inverting signal path configured to receive the input signal and to generate the first single ended signal based on the input signal, wherein the first single ended signal and the input signal have opposite polarities; and
- a non-inverting signal path configured to receive the input signal and to generate the second single ended signal based on the input signal, wherein the second single ended signal and the input signal have the same polarity.

20. The method of claim 17, wherein the first and second latches comprise a common type of latch.

* * * * *